United States Patent [19]
Lewis et al.

[11] Patent Number: 5,418,880
[45] Date of Patent: May 23, 1995

[54] HIGH-POWER OPTICAL FIBER AMPLIFIER OR LASER DEVICE

[75] Inventors: John R. Lewis, Acton; Martin H. Muendel, Cambridge, both of Mass.

[73] Assignee: Polaroid Corporation, Cambridge, Mass.

[21] Appl. No.: 283,381

[22] Filed: Jul. 29, 1994

[51] Int. Cl.⁶ .............................. G02B 602; G02B 6/10
[52] U.S. Cl. ..................................... 385/123; 359/625
[58] Field of Search ................. 385/123–127, 385/147; 359/625, 741; 372/6–8, 109

[56] References Cited

U.S. PATENT DOCUMENTS

| | | | |
|---|---|---|---|
| 4,428,647 | 1/1984 | Sprague et al. | 350/167 |
| 4,763,975 | 8/1988 | Scifres et al. | 350/96.15 |
| 5,168,401 | 12/1992 | Endriz | 359/625 |
| 5,268,978 | 12/1993 | Po et al. | 385/33 |
| 5,319,496 | 6/1994 | Jewell et al. | 359/741 |

*Primary Examiner*—Akm E. Ullah
*Attorney, Agent, or Firm*—Joseph Stecewycz

[57] ABSTRACT

A high-power optical fiber device comprising a pump source of light-emitting facets, optical means for collimating and converging the array, an optical beam rotator for transforming the array by rotating individual light emissions, and an optical fiber structure having a core surrounded by an inner cladding for transferring pump energy into the core, the inner cladding having a cross-sectional shape in the form of a convex polygon.

12 Claims, 9 Drawing Sheets

HIGH-POWER OPTICAL FIBER AMPLIFIER OR LASER DEVICE

CROSS REFERENCE TO RELATED APPLICATIONS

This application is related to the concurrently filed U.S. patent applications, U.S. Ser. No. 08/283,225, of John R. Lewis entitled "Device for Optically Converting a Plurality of Beams" and Ser. No. 08/283,226, of Martin H. Muendel entitled "Optical Fiber Structure for Efficient Use of Pump Power", both colony assigned herewith, The contents of the concurrently filed Lewis and Muendel applications are hereby incorporated into and made part of this application as if fully recited herein.

FIELD OF THE INVENTION

This invention relates to laser systems and, more particularly, to a laser device having a high-power, single-mode output.

BACKGROUND OF THE INVENTION

General Background

Coherent optical radiation, or laser light, is used extensively in communications, medicine, research, imaging, and in many other areas of technology. In such applications, the laser radiation may be used directly or may be used as an intermediate pump source for purposes of promoting amplification or subsequent laser action. When an application's power requirements are small, on the order of several milliwatts more or less, and beam quality is not an overriding concern, laser diodes have been extensively employed because they are directly modulatable and of convenient size and acceptable beam quality. Where modest power is needed, on the order of a watt or so with superior beam quality, such as a diffraction-limited spot, optical fiber lasers with solid state pump sources have been used. For higher power applications where several watts may be needed, as in certain printing applications, use has been made of laser diode arrays as pump sources coupled to special fiber gain structures. For even higher power requirements, ten watts or more, high power laser diode arrays, whose cavities emit a few modes, may be coupled to such specialty gain fibers. However, care must be taken to assure efficient coupling power if maximum power benefit is to be achieved. Since single-mode cores are small, 10 $\mu$m or less, and typical materials limit the size of fiber numerical apertures (NA), it is virtually impossible to efficiently couple multimode laser array energy directly into single-mode gain cores via end fire coupling techniques.

As mentioned above, high-power laser light can be obtained by combining the outputs from the emitting cavities of laser diode arrays. However, combining the separate outputs in such a manner that brightness is conserved and power losses are kept to a minimum can be difficult to achieve.

The difficulty results from the fact that the aggregate output of a multiple laser source is not configured for efficient coupling into an optical fiber due to a mismatch between geometric properties and numerical apertures of the source and the receiving fiber. A typical multiple laser source may be a laser bar 10, as shown in FIG. 1. Optical radiation is emitted from a light-emitting face 11 along which are positioned a plurality of laser cavities. In the example provided, light-emitting face 11 includes a laser diode 12 positioned at an array interval spacing 16 from an adjacent laser diode 13. Laser diode 12 typically has an emitting facet output in the shape of a long, narrow rectangle and is oriented with its long dimension parallel to a laser bar axis 14.

For the purpose of illustration, a set of laser-beam uvw-coordinates 19 is used to describe the propagation characteristics of the beams of radiation emitted from the laser diodes. The orientation of the w-axis is perpendicular to light-emitting face 11 and coincident with the direction of propagation of the beams of radiation. Coordinate set 19 "travels" with each beam, rotating about the w-axis as the beam is rotated, and changing direction as the beam's direction of propagation is changed. Laser diode 12 emits a laser beam 20 and laser diode 13 emits a laser beam 21 and so on.

The radiation distributions of the emitted laser beams 20 and 21 are represented by ellipses to indicate that they each have a v-component parallel to laser bar axis 14 and a u-component perpendicular to laser bar axis 14. A more quantitative representation of the laser beam divergence is provided in the graphical illustration of FIG. 2, which shows that each laser beam diverges at a larger angle $\theta_u$ in the u-direction than the angle of divergence in the v-direction $\theta_v$, as the laser beam propagates in the w-direction. NA values, measured to include 95% of the optical power, are typically 0.70 to 1.75 (40° to 100°) for $NA_u$ and 0.14 to 0.35 (8° to 20°) for $NA_v$. Before such laser beams can be guided into an optical fiber, a coupling device is needed to reformat the radiation into a more suitable configuration that is more compatible with the geometry and the NA of the fiber.

A measure of coupling mismatch between two optical components can be provided by a quantitative comparison of the "etendu" values for the two components. The etendu of a component is defined as the mathematical product of the angular extent and the spatial extent of the radiation entering or emitting from that component:

$$\text{etendu} \underline{\Delta} [\text{angular extent}] \times [\text{spatial extent}]$$

To illustrate, assume laser bar 10 to have a linear array of twenty laser diodes on a face 1.00 cm long by 0.1 mm wide. If laser diodes 12 and 13 are one $\mu$m in the u-direction and 175 $\mu$m in the v-direction, with an array interval spacing 16 of 485 $\mu$m center-to-center, $NA_u$ 25 is approximately 0.55 (31.5°) and $NA_v$ 27 is approximately 0.12 (6.9°) for a wavelength of 1.06 $\mu$m, as indicated in FIG. 1.

For laser diode 12, the u-component etendu value becomes 1 $\mu$m×0.55 NA, or 0.55 $\mu$m-NA, and the v-component etendu value is 175 $\mu$m×0.12 NA, or 21 $\mu$m-NA. For laser bar 10, the u-component etendu is also 0.55 $\mu$m-NA. The v-component etendu for laser bar 10 is 1,200 $\mu$m-NA, which is more than two thousand times as great as the u-component etendu. In comparison, a typical optical fiber core with an NA of 0.1 and diameter of 7.5 $\mu$m has an etendu of 0.75 $\mu$m-NA. Direct coupling of the laser array into an optical fiber would consequently be extremely inefficient.

A mismatch of this magnitude cannot be corrected solely by the use of anamorphic imaging systems even though they have different spatial magnification in the two orthogonal directions. Any practical imaging system which decreases the etendu mismatch between a laser diode array and an optical fiber must perform more complicated reformatting tasks including rotating each emitted diode beam by 90° before optical corrections to the beam are made by the imaging system.

Hence, because of incompatible beam configuration, coupled with inherent practical limits on optical fiber numerical apertures (i.e., solid acceptance cones), it remains difficult, if not impossible, to efficiently couple these higher power sources into cores, especially single-mode cores which would require a single-mode pump for efficient coupling.

However, Snitzer et al. disclosed an elegant solution to this problem in U.S. Pat. No. 4,318,079, and provided a significant improvement over an earlier approach by Maurer, as described in his U.S. Pat. No. 3,808,549. In the Snitzer et al. scheme, now referred to as "cladding pumping", a single-mode core containing the active ion is surrounded by an undoped inner multimode cladding of lower index than that of the core and is of a special geometry for efficient pumping. This, in turn, is surrounded by an outer cladding of yet lower index of refraction. Pump light is launched into the inner cladding and is confined by total internal reflection at the interface between claddings to propagate down the inner cladding, which is a core-like structure with respect to the outer cladding. The inner cladding, being multimode, is obviously physically larger than the core and therefore presents a better target, and the numerical aperture, being a function of the indices of the inner and outer claddings, is made as large as possible to more efficiently receive pump power. As pump power propagates down the inner cladding, it is progressively absorbed by the core to provide the population inversion necessary for gain and subsequent laser action with suitable feedback. This scheme is a hybrid having the character of both longitudinal and transverse pumping, and has the great merit of efficiently coupling available pump power from an incoherent source to a single-mode core to provide single-mode output. Inner cladding geometries that have been found efficacious include elongated slab configurations, like the rectangle, and a configuration in which a core is eccentrically located inside of the inner cladding.

It is therefore an objective of the present invention to provide a high-power optical fiber device which combines the outputs of multiple laser sources into a single high-power beam of optical radiation.

It is a further object of the invention to provide such an optical fiber device in which the single output beam can be efficiently coupled into an optical fiber core.

It is a further object of the invention to provide such an optical fiber device in which the inner cladding cross-sectional shape can be efficiently matched to different input beam characteristics.

It is another object of the invention to provide such an optical fiber device in which the optical fiber provides a uniform distribution of radiation modes within the inner cladding.

It is yet another object of the invention to provide such an optical fiber device in which the fiber radiation coupling efficiency is not a function of the location of the fiber core.

Other objects of the invention will, in part, appear hereinafter and will, in part, be apparent when the following detailed description is read in connection with the drawings.

SUMMARY OF THE INVENTION

A high-power optical fiber device, for amplification or for laser applications, is disclosed having a pump source comprising multiple light-emitting facets, or laser sources, and optical system for transforming and converging the plurality of light emissions, or beams, onto an optical fiber comprising a core and an inner cladding surrounding the core. The optical system includes a specially-configured, easily-fabricated, multi-faceted surface used in combination with other elements to combine the outputs from the array of beams so that their combined energy can be efficiently introduced into an optical fiber structure. In the inventive device, the beams from the pump source are collimated, and combined by an optical coupler, comprised of an optical rotator and an optical system for collimating and focusing the individually-rotated laser beams, into a single beam of optical radiation. The optical beam rotator includes a planar strip with a surface having a plurality of adjacent parallel grooves, one groove for each of the laser beams. Every groove is comprised of two reflecting facets forming a dihedral angle with a vertex edge common to both facets. The reflecting facets may be coated to provide a high reflectivity for the laser beams. The vertex edge defines an aspect angle with respect to the direction of propagation of the corresponding laser beam such that the laser beam is rotated about its direction of propagation upon undergoing two sequential reflections from the reflecting facets common to the corresponding vertex edge. In an alternative embodiment, an optically-transparent rotator is used to rotate each laser beam. The optically-transparent rotator provides internally-reflecting surfaces comprising boundaries between the rotator and the ambient medium, where the ambient medium has a lower index of refraction than the material comprising the optically-transparent rotator. The internally-reflective surfaces form a concave reflecting pair having a dihedral angle with an apex edge common to both surfaces. The apex edge defines an aspect angle with respect to the direction of propagation of the corresponding laser beam such that the laser beam is rotated about its direction of propagation upon undergoing two sequential reflections from the concave reflecting pair common to the corresponding apex edge. The optical fiber structure comprises a core surrounded by an inner cladding for transferring pump energy into the core, the inner cladding having a cross-sectional shape in the form of one of several preferred convex polygon shapes. The polygon shape used for a particular application is selected so that the resultant NA of the inner cladding having the selected shape will closely match the NA of the single beam of optical radiation introduced into the optical fiber.

BRIEF DESCRIPTION OF THE DRAWINGS

The novel features that are considered characteristic of the present invention are set forth with particularity herein. The organization and method of operation of the invention, together with other object and advantages thereof, will be best understood from the following description of the illustrated embodiments when read in conjunction with the accompanying drawings wherein.

Figure 3:
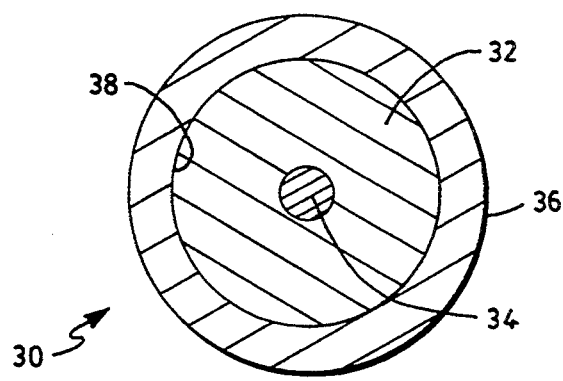
Figure 4:
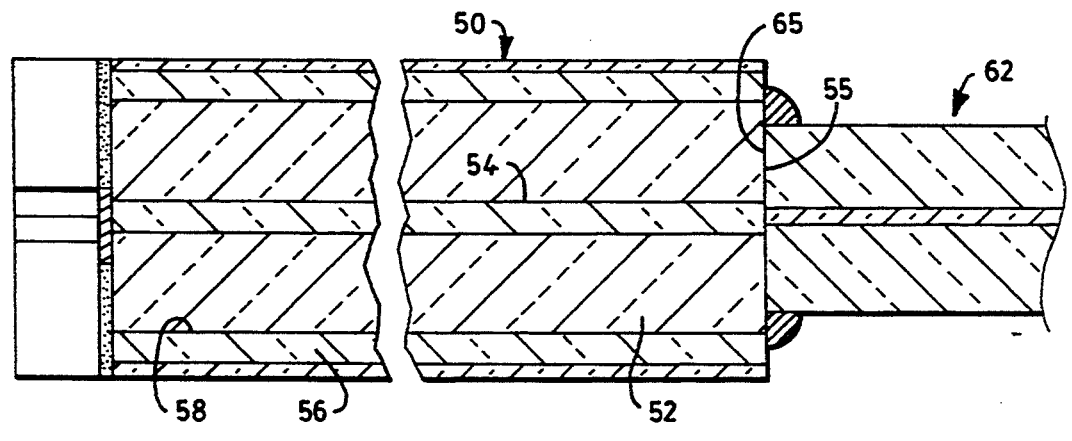
Figure 5:
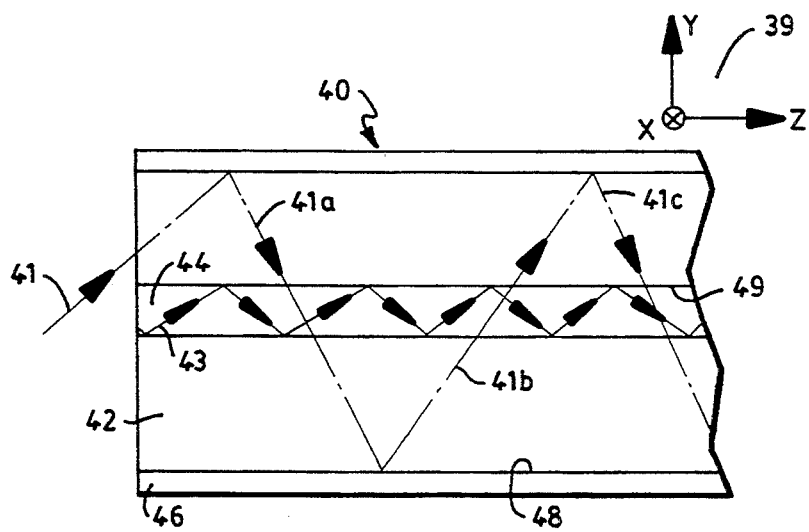
Figure 6:
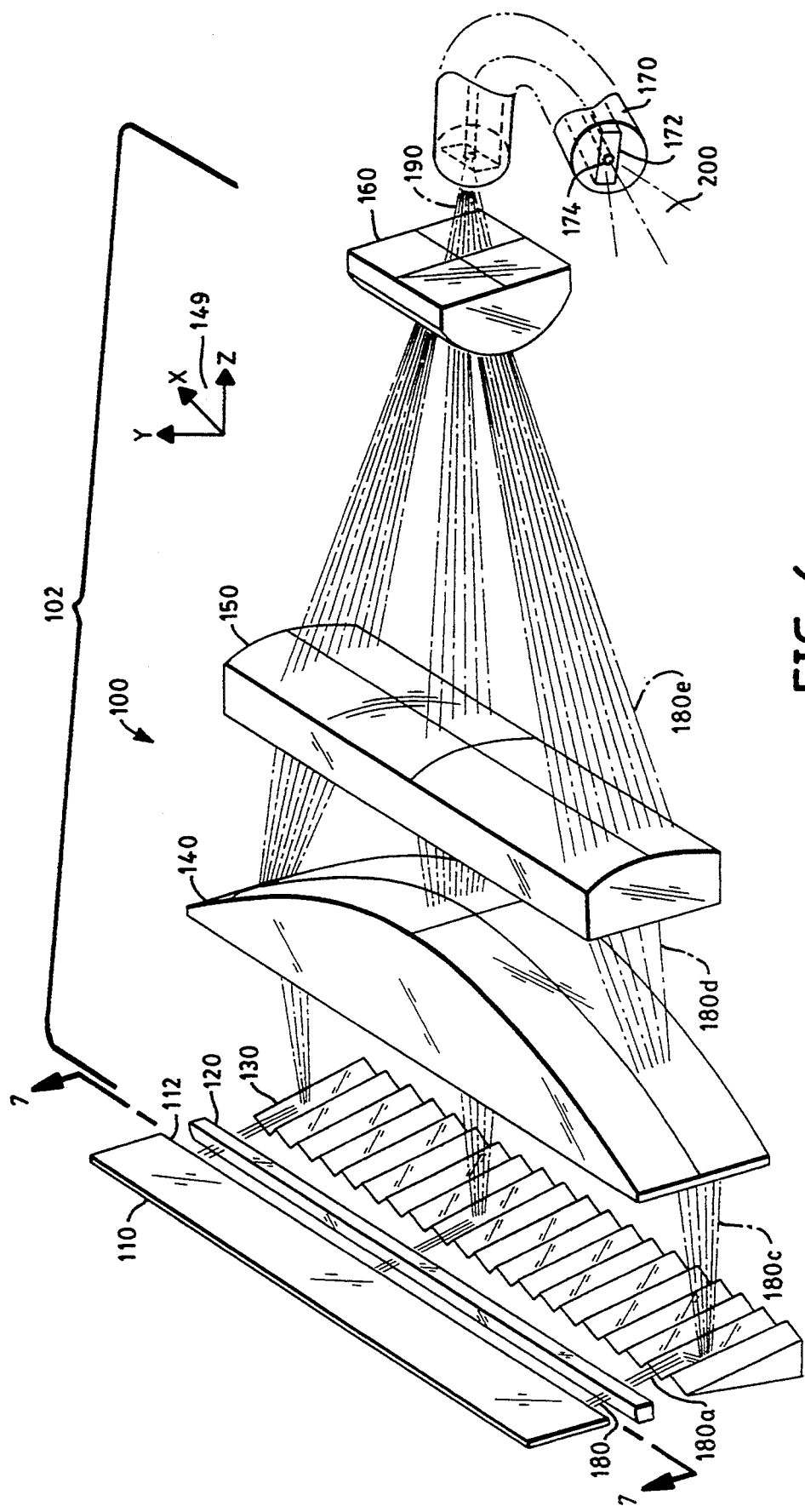
Figure 7:
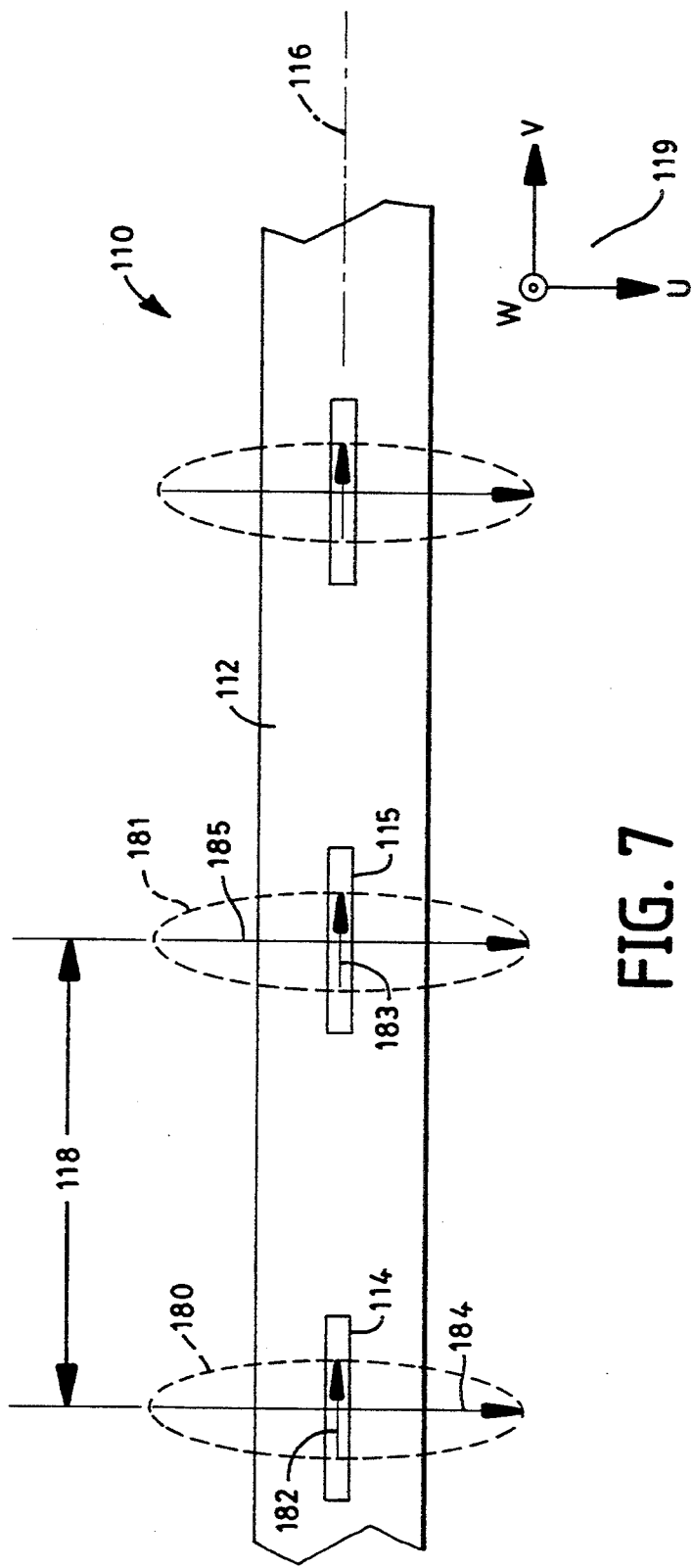
Figure 8:
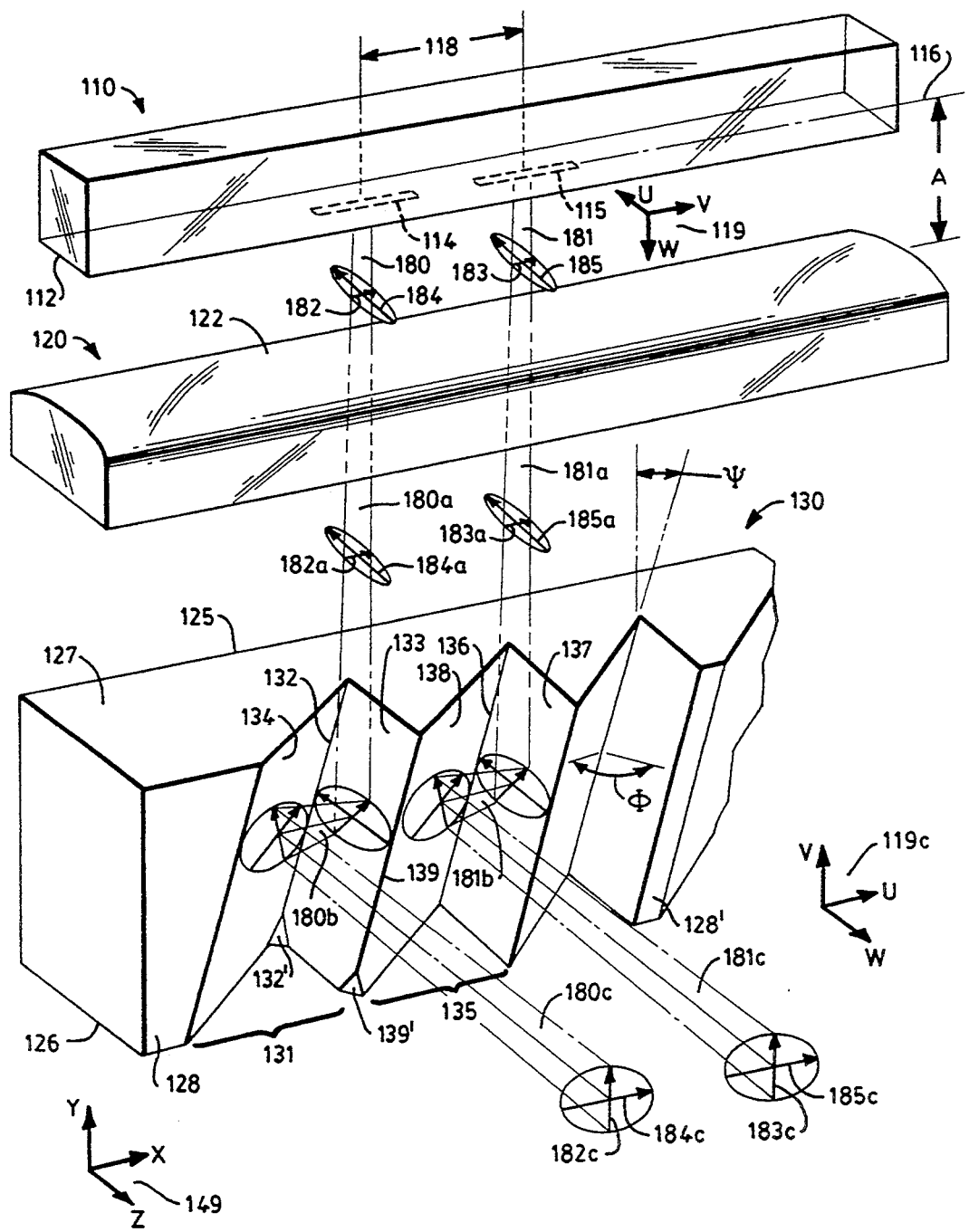
Figure 9:
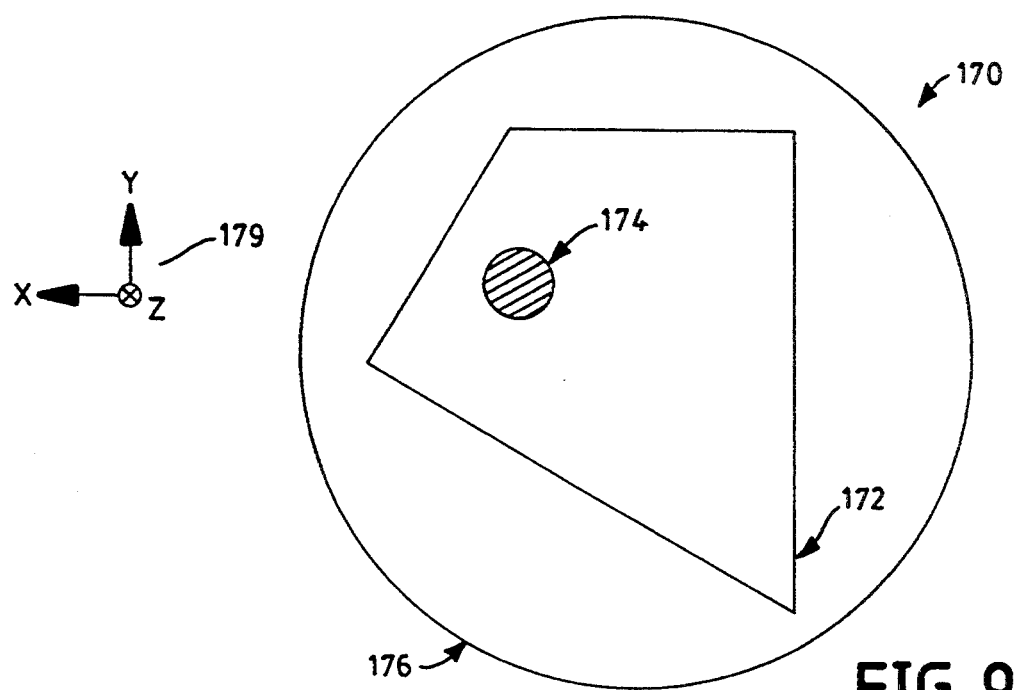
Figure 12:
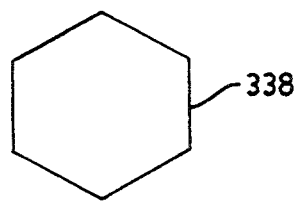
Figure 13:
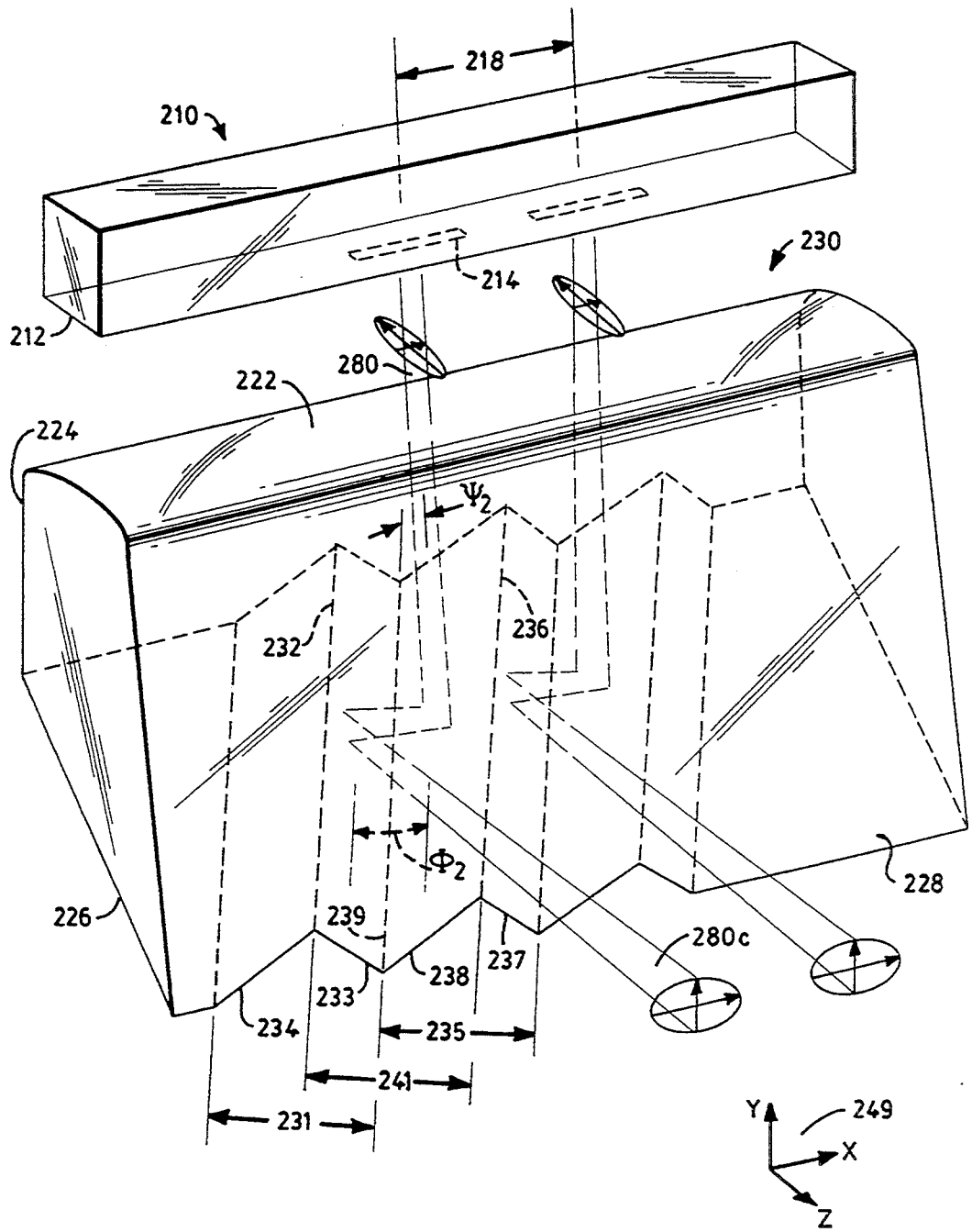
Figure 14:
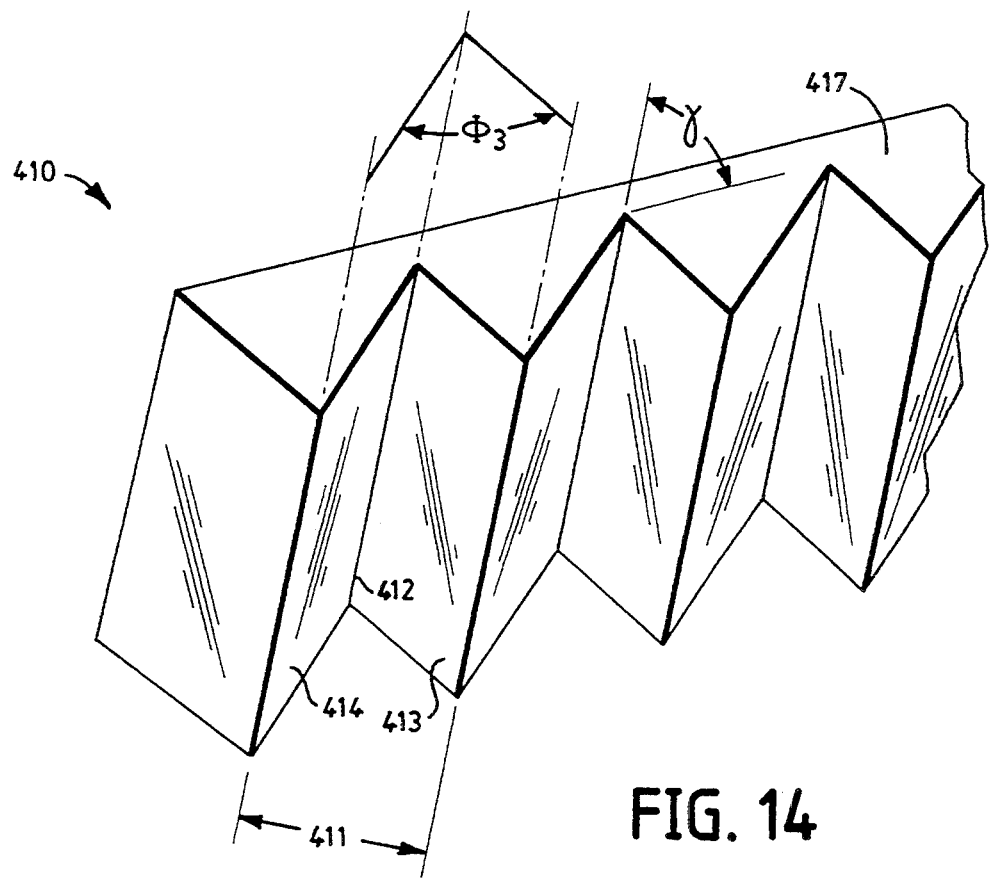
Figure 15:
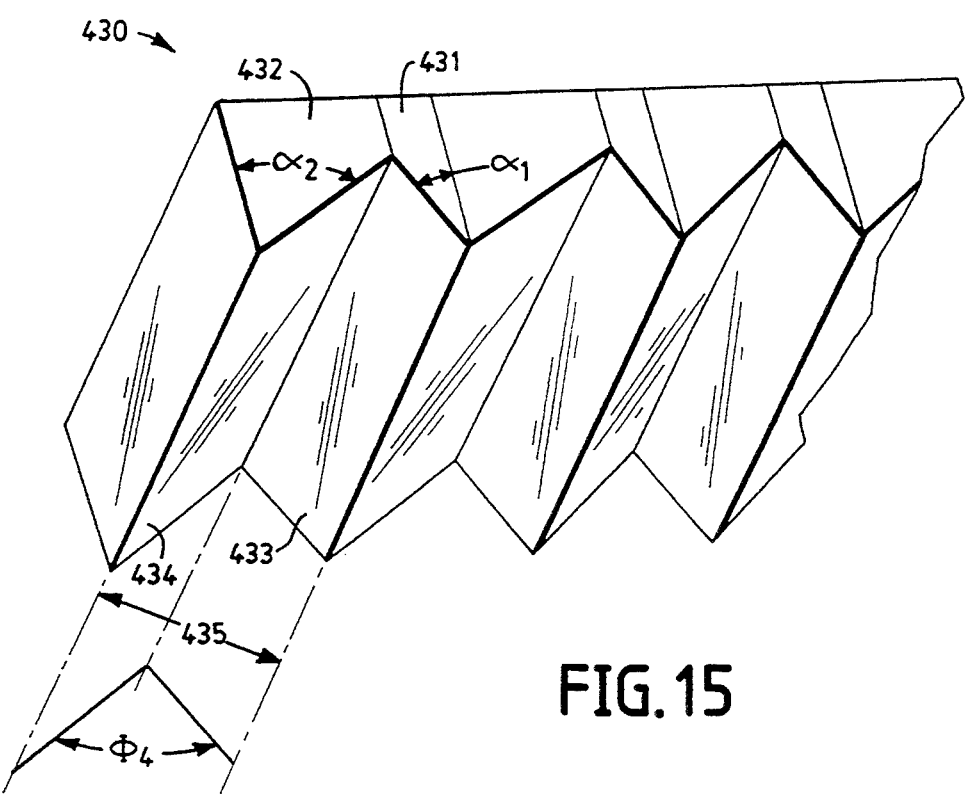

1, where both divergence parallel to the laser bar axis ($\theta_u$) and divergence perpendicular to the laser bar axis ($\theta_v$) are provided;

FIG. 3 is a diagrammatic cross-sectional view of a prior art optical fiber having a core doped with a gain species, surrounded by an inner cladding, which in turn is surrounded by an outer cladding;

FIG. 4 is a diagrammatic longitudinal cross-sectional view of a prior art optical fiber aligned with an optical waveguide and coupled to a source of radiation;

FIG. 5 is a longitudinal cross-sectional view of a prior art fiber laser and includes lasing rays propagating within the fiber laser core;

FIG. 6 is a diagrammatic perspective view of an amplifier or laser system according to the present invention showing a laser bar, a beam collimator, an optical beam rotating device, focusing optics, and an optical fiber;

FIG. 7 is a diagrammatic front-elevational view of the light-emitting face of the laser bar of FIG. 6;

FIG. 8 is a diagrammatic perspective view of a portion of the optical system of FIG. 6 showing the optical beam rotating device reformatting individual laser light sources emitted by the laser bar;

FIG. 9 is a diagrammatic cross-sectional view of an optical fiber, having a waveguide according to the invention, illustrating the projections, in the cross-sectional plane, of a series of ray segments representing a ray propagating along the length of the fiber;

FIGS. 10A through 10D are diagrams of optical fiber embodiments for a waveguide cross section of three sides according to the present invention;

FIGS. 11A through 11D are diagrams of optical fiber embodiments for a waveguide cross section of four sides according to the present invention;

FIG. 12 is a diagram of an optical fiber embodiment for a waveguide cross section of six sides according to the present invention; and FIG. 13 is a diagrammatic detailed perspective view of a portion of an alternative embodiment of the system of FIG. 6 and shows an integral beam collimating and rotating device;

FIG. 14 is a diagrammatic perspective view of an alternative embodiment of the optical beam rotating device of FIG. 8, comprising a strip of monocrystalline substance having an array of grooves etched into one surface; and FIG. 15 is a diagrammatic perspective view of yet another embodiment of the optical beam rotating device of FIG. 8, comprising a plurality of stacked plates, where each stacked plate has an angled, or wedged, end.

INTRODUCTION

Optical fiber amplifiers and lasers commonly function with optical radiation propagating within the core of a component optical fiber. During operation of the amplifier or laser, signal or pump radiation is injected at one end of the optical fiber, is confined and guided by the fiber, and emerges from the other fiber end as an amplified signal or as lasing radiation.

FIG. 3 is a cross-sectional view of a circularly-symmetric multiclad optical fiber 30 comprising a core 34, an inner cladding 32 surrounding the core 34 and an outer cladding 36 surrounding the inner cladding 32. Core 34 can range from 2 to about 10 μm in diameter for single-mode generation. In low-power applications, the pump radiation is typically single-mode and can be injected directly into core 34. When the index of refraction $n_1$ of core 34 is larger than the index of refraction $n_2$ of the inner cladding 32, the radiation can be largely confined within core 34 by means of total internal reflections. As is well known in the art, total internal reflections will occur when radiation strikes the core boundary at an angle smaller than a critical angle $\theta_c$. Angle $\theta_c$, which is measured from the normal to the core boundary, is found from the relationship $\sin \theta_c = \sin^{-1}(n_2/n_1)$.

However, because most available single-mode radiation sources are low in power, such sources will not suffice for an application requiring high power levels, even with efficient coupling. For these applications, an input source of higher power is required, but such sources are typically multimode and cannot be injected directly into an optical fiber core without incurring loss of brightness. One early solution to this problem was to indirectly inject the multimode radiation into the inner cladding, where the inner cladding functioned as a waveguide region to contain and guide such injected radiation.

For an optical fiber, such as fiber 30, inner cladding 32 functions as a waveguide by means of internal reflections of the radiation occurring at an interface 38 lying between inner cladding 32, with index of refraction $n_2$, and outer cladding 36, with a smaller index of refraction $n_3$. The purpose of inner cladding 32 is to confine the injected radiation so that the radiation repeatedly intersects the core 34 as it propagates along the length of fiber 30. With each such intersection with core 34, a portion of the pump radiation is absorbed by an active gain dopant contained within core 34. The length of an optical fiber is typically tens of meters so as to produce a large number of these interactions and allow the core to absorb as much pump radiation as possible.

Figure 1:
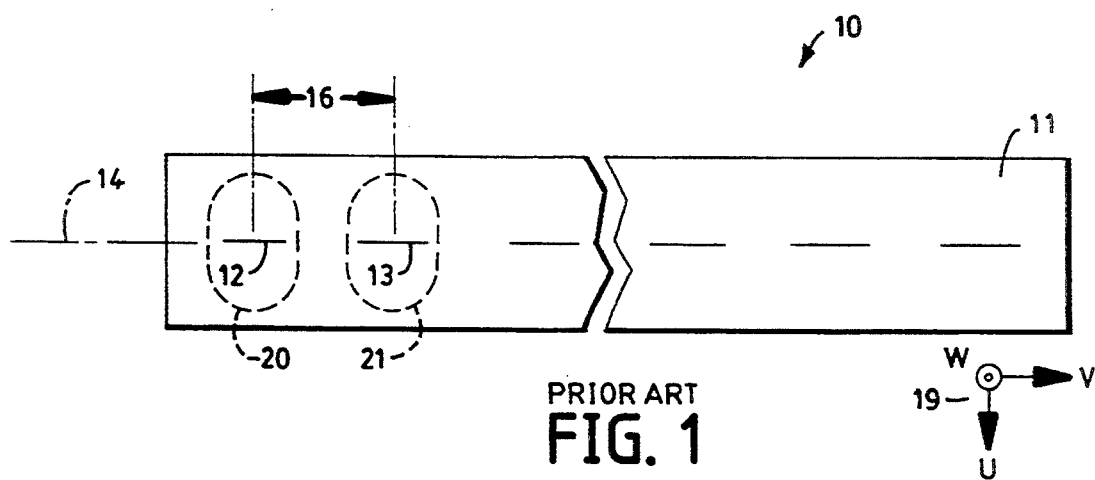
FIG. 1 is a diagrammatic view of the front light-emitting face of a prior art laser bar showing multiple laser diodes arrayed along a laser bar axis.

Optical amplifiers may make use of fiber configurations, such as that shown in FIG. 3, to couple amplifying radiation into a signal propagating in the fiber core. U.S. Pat. No. 3,808,549 issued to Maurer discloses an optical communication device comprising a radiation source aligned with an optical fiber. The communication device includes an optical fiber 50 and an optical waveguide 62, both shown in longitudinal cross section in FIG. 1 of that patent, here shown as FIG. 4. Optical fiber 50 comprises an inner transparent cladding layer 52 disposed on the surface of a core 54, and a thin outer cladding layer 56 disposed on the surface of the inner cladding layer 52. An output end 55 of optical fiber 50 is aligned with an input end 65 of the optical waveguide 62. Radiation generated in core 54 is coupled to the optical waveguide 62.

Figure 2:
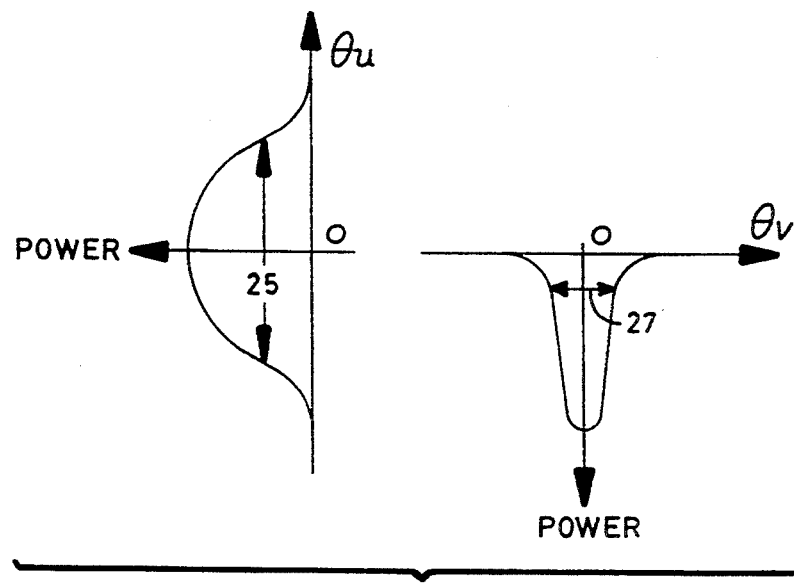
FIG. 2 is a pair of graphs depicting optical power divergence for each laser diode in the laser bar of FIG.

U.S. Pat. No. 4,829,529 issued to Kafka discloses a multiclad optical fiber used as a lasing cavity for a fiber laser. FIG. 2 of the reference patent provides a cross-sectional side view of a single-mode fiber with associated multimode fiber pumping cavity. This illustration is presented here as FIG. 5. An xyz-coordinate system 39 is included to aid in discussion.

A fiber laser 40 is comprised of a single-mode core 44 surrounded by a multimode cladding 42 and an outer layer 46, the latter two of which define a pump cavity. The indices of refraction for cladding 42 and outer layer 46 are chosen so that pump radiation will be totally internally reflected at an interface 48. As the radiation propagates along the cladding 42, it may intersect the core 44 many times and couple to a laser gain medium within the core 44, provided it is in a mode which behaves in this manner. However, not every mode that is excited in such a structure will propagate along a path that intersects the core. In fact, skew rays, which carry the bulk of the pump energy, are concentrated in an annular region surrounding the core and therefore never intersect it. Because the core is located in the center, away from the location of most of the pump energy, such circularly symmetric fiber structures are terribly inefficient users of available pump power and therefore not of any practical interest. The nonuniform modal distribution in circularly symmetric fibers is a consequence of the geometry, and the circular geometry and central core placement are simply unsuitable for efficient use of pump power.

One method of improving fiber coupling efficiency without changing the fiber core diameter is disclosed in U.S. Pat. No. 5,291,501 issued to Hanna, which describes the use of "cladding pumping" to input multimode radiation into an optical fiber core. In the reference patent, an inner cladding is doped with a first active material and a single-mode core is doped with a second, different laser active material such that, when the inner cladding is pumped, the resulting lasing emission serves as pump radiation for the laser active dopant in the optical fiber core. The reference states that the radiation is more readily absorbed into the active material of the inner cladding rather than into the core by leakage. The pump radiation is thereby absorbed in a much shorter length than the absorption length for other cladding pumping arrangements which utilize a transparent inner cladding. However, this approach requires that the inner cladding incorporate an active dopant.

Conventional optical fiber amplifiers and fiber systems, such as those described above, incorporate optical fibers having a circular cross section. These systems have sought to improve the optical fiber coupling efficiency without fully appreciating the limitation imposed upon the coupling process when the inner cladding layer is in the form of a rotationally symmetric waveguide. When a circular waveguide is used to contain and couple radiation into a central core, the resulting distribution of radiation within the waveguide is not isotropic and, therefore, not every radiation mode intersects the core. Consequently, not all the radiation present in the optical fiber is available for absorption by the fiber core.

The high-power amplifier or laser disclosed herein utilizes double-clad optical fiber configurations which produce a uniform distribution of radiation modes within the inner cladding. Such configurations expose the core to all radiation modes. Further, the core can be positioned essentially anywhere within the inner cladding without affecting the coupling efficiency of the fiber. It has been found that a uniform radiation field is produced when the waveguide region, or inner cladding, of an optical fiber has a geometric shape which meets certain criteria. These criteria are presented in related application Case No. 7922 assigned to the same assignee as the present application.

DETAILED DESCRIPTION OF THE INVENTION

Referring now to FIG. 6, there is shown a high-power laser system 100 according to the present invention. Laser system 100 is comprised of three major components: a source of radiation 110, an optical fiber 170 with a single-mode core, and a coupling mechanism 102 for directing radiation from source 110 into the optical fiber 170. Source radiation, consisting of multiple laser radiation sources with an aggregate power output of about 20 watts, is converted into a single, well-behaved $TEM_{0,0}$ output of high-density radiation, typically 17 watts at the output end of fiber 170. This configuration makes laser system 100 useful for printing and other imaging applications.

The functions and relative placements of the components of high-power laser system 100 are explained by reference to a set of laser-system xyz-coordinates 149.

The preferred radiation source is a laser bar 110 comprised of an array of laser diodes. A suitable commercially-available laser bar may be of the type available from SDL, Inc., San Jose, Calif. Laser bar 110 has a light-emitting face 112 containing the emitting facets of a linear array of laser diodes distributed along a laser bar axis 116 as shown in FIG. 7. Laser bar axis 116 is oriented parallel to the x-axis of xyz-coordinate system 149, and light-emitting plane 112 is oriented parallel to the x-z plane. Each laser diode in the linear array, such as laser diode 114, for example, has an emitting surface of 1000 $\mu$m by 1 $\mu$m. Array interval spacing, such as the interval 118 between laser diode 114 and an adjacent laser diode 115, is approximately 485 $\mu$m center-to-center.

A set of laser-beam uvw-coordinates 119 will be used to facilitate discussion of laser beam propagation. The direction of propagation of any laser diode in the array is aligned with the w-axis of the uvw-coordinates 119. Coordinate set 119 travels with each beam, rotating about the w-axis as the beam is rotated, and changing direction as the beam's direction of propagation is changed. Each laser beam in the beam array has a near-field NA of approximately 0.55 (31.5°) in the u-w plane and 0.12 (6.9°) in the v-w plane. For example, laser diode 114 is shown emitting a laser beam 180, represented by an ellipse, having a v-component 182 and a u-component 184. These emitted laser beams initially propagate in the negative y-direction of the laser-system coordinates 149 and pass into the coupling mechanism 102 of laser system 100 where the laser beams are reformatted. The reformatting process, which is the same for each emitted laser beam in the laser array, will be described for laser beam 180 emitted by laser diode 114.

As shown in FIG. 6, laser beam 180 is first directed into a cylindrical lens 120 which collimates it in a first azimuth, that is, in the u-w plane. Lens 120 has a circular curvature in the x-y plane and serves to collimate laser beam 180 in the y-z plane to yield laterally-collimated laser beam 180a. The growth of laser beam 180 in the y-z plane is decreased as it passes through lens 120 and remains decreased as the beam continues to propagate through laser system 100. If desired, lens 120 can be alternatively configured with a parabolic or other noncircular surface. A more generally-shaped noncircular collimating lens will introduce fewer aberrations into laterally-collimated laser beam 180a, but the positioning tolerances for such a lens would be more critical than the tolerances for a circular lens. Laser beam 180a emerges from lens 120 collimated in the u-w plane, but continues to diverge a second azimuth, that is, in the v-w plane.

Laterally-collimated laser beam 180a is subsequently rotated 90° along its axis of propagation by means of an optical beam rotator 130. Laser beam 180a undergoes two successive reflections off reflecting facets of optical beam rotator 130 to yield a rotated laser beam 180c.

After passing through optical beam rotator 130, rotated laser beam 180c continues to diverge in the v-direction, but remains collimated in the u-direction.

Rotated laser beam 180c then passes through a cylindrical steering lens 140 which acts to converge rotated laser beam 180c into a conveying laser beam 180d. Steering lens 140 also acts to converge the entire array of rotated laser beams in the x-z plane. Note that although the array of laser beams is laterally bent towards the z-axis by lens 140, each individual laser beam continues to diverge in the second azimuth.

This divergence of converging laser beam 180d is stopped in the second azimuth plane by means of a second cylindrical collimating lens 150. Laser beam 180d passes through lens 150 to produce a collimated laser beam 180e. The array of collimated laser beams, including collimated laser beam 180e, continues to converge in the x-z plane because of the previous passage through steering lens 140.

A focusing lens 160 acts to convert the array of laser beams collimated by second collimating lens 150, including collimated laser beam 180e, into a focused beam 190 at a waveguide 172 of an optical fiber 170. Focused beam 190 is approximately 360 μm in size with an NA of 0.47 (27°) in the x-z plane and is approximately 120 μm in size with an NA of 0.47 (27°) in the y-z plane. Optical fiber 170 may be part of an optical amplifier or a fiber laser device.

Collimation of Laser Beams by Collimating Lens 120

As shown in FIG. 8, laser diode 114 emits laser beam 180 initially in the direction aligned with the w-axis of the uvw-coordinates 119. The spatial distribution of laser beam 180 is represented by an ellipse. Beam divergence in the v-w plane is indicated by the change in v-component 182 and beam divergence in the u-w plane is indicated by the change in u-component 184. Similarly, laser diode 115 emits a laser beam 181, also represented by an ellipse, and beam divergences in the v-w plane and in the u-w plane are indicated by components 183 and 185 respectively. With the emitting region dimensions of 1000 μm by 1 μm specified above, laser beams 180 and 181 will each have a divergence, NA, of about 0.12 (6.90°) in the v-w plane and about 0.55 (31.5°) in the u-w plane.

First collimating lens 120 is a cylindrical lens positioned parallel to and approximately the same length as laser bar 110. The focal length of lens 120 is chosen so as to yield a collimated beam of maximum dimension while still passing through an aperture limit set by the geometry of beam rotator 130 as discussed below, such that no occlusion of light occurs. In a preferred embodiment, first collimating lens 120 has a cylindrical surface 122 producing a focal length of 213 μm. The distance from cylindrical surface 122 from light-emitting plane 112, indicated by dimension "A" in the illustration, is selected so that the size of laser beams 180 and 181 at cylindrical surface 122 is approximately 234 μm in the u-w plane. Accordingly, the width of lens 120 is a minimum of 234 μm wide so as to intercept essentially all the radiation emitted by the array of beams.

Laser beam 180 emerges as a laterally-collimated laser beam 180a after passing through first collimating lens 120. Because surface 122 is cylindrical, laser beam 180a continues to grow somewhat in the first azimuth, that is, the u-w plane, but the amount of growth is so small, with NA about 0.002 (0.11°), that it can be ignored, given the other geometry of the system. Laterally-collimated laser beam 180a continues to diverge in the v-w plane as indicated by v-component 182a, which is shown as being longer than v-component 182. In comparison, u-component 184a remains unchanged in length from u-component 184 to indicate that beam 180a is essentially collimated in the first azimuth. Similarly, laser beam 181 emitted by laser diode 115 emerges as a laterally-collimated laser beam 181a with a growing v-component 183a.

Description of Optical Beam Rotator 130

As seen in greater detail in FIG. 8, optical beam rotator 130 is comprised of an array of contiguous vee-shaped grooves, such as groove 131, formed on a front surface 128 of a planar strip 125. Intergroove spacing along optical beam rotator 130 in the x-direction is the same as the laser array interval spacing 118 along the laser bar axis 116. Beam rotator 130 thus provides one groove for each laser diode in laser bar 110. The front surface 128 of planar strip 125 is aligned with the x-axis of xyz-coordinate system 149 such that optical beam rotator 130 receives the linear array of laser beams emitted by laser bar 110. In the example provided, laser beam 180 is emitted by laser diode 114 and is received by a groove 131, and laser beam 181 is received by an adjacent groove 135.

Groove 131 is comprised of a first reflecting facet 133 and a second reflecting facet 134. Reflecting facets 133 and 134 are in opposed relationship to one another and meet at a common line of intersection, vertex edge 132, to form a dihedral angle $\Phi$ of 60°. Adjacent groove 131 is groove 135 comprised of a third reflecting facet 137 and a fourth reflecting facet 138 which meet at a vertex edge 136. Reflecting facets 133 and 138 preferably meet at a common line of intersection to form an apex edge 139. Alternatively, the grooves can be made more shallow as needed. Because the intergroove spacing is fixed by the configuration of laser bar 110, the spacing does not change if shallower grooves are used. Accordingly, with shallow grooves apex edges 139 form a plurality of flat, narrow strips, such as strip 128', and comprise a portion of front surface 128.

The grooves are all similarly oriented so that alternating reflecting facets, such as first reflecting facet 133 and third reflecting facet 137, (or second reflecting facet 134 and fourth reflecting facet 138) are parallel to one another. For ease in forming the array of grooves, each groove extends from a top edge 127 of planar strip 125 to a lower edge 126. This configuration allows the fabrication of planar strips by the method of forming grooves in the surface of a planar substram which is subsequently divided into strips. Additionally, all reflecting facets are of equal width and, after forming, are coated in a well-known manner to provide high reflectivity for the radiation emitted by the laser diodes.

Optical beam rotator 130 is oriented, with respect to laser bar 110, such that each groove receives and rotates an incident laser beam. In this orientation, each groove vertex edge, such as vertex edge 132 of groove 131, lies at a 45° angle in the x-y plane and also forms an angle of 135° in the y-z plane of the set of laser-system xyz-coordinates 149. This orientation results in an aspect angle $\Psi$ of approximately 54.7° between the w-axis of propagation of a laser beam and the vertex edge of the groove receiving the laser beam.

Because the individual laser beams do not exhibit coherent interaction if combined, care is taken to avoid optical coupling between adjacent laser beams. To insure that there will be no such optical coupling, optical beam rotator 130 is positioned so that each laser beam is confined to a separate groove. This requires that optical beam rotator 130 be placed close enough to laser bar 110 to insure that the expanding radiation pattern from a laser beam does not fall outside its corresponding groove. For a laser array interval spacing 118 of 485 μm, the effective intergroove spacing on beam rotator 130 in the x-direction is also 485 μm. For a groove dihedral angle Φ of 60°, this results in a width of approximately 396 μm for the groove wall. This width requires careful placement of first reflecting surface 133 with respect to light-emitting plane 112. The size of laterally-collimated laser beam 180a is about 234 μm and should be completely intercepted by a reflecting surface 396 μm wide.

An advantageous feature of optical beam rotator 130 is that the planar array of grooves can be formed either by means of a cutting tool drawn across the surface of a suitable substrate or by means of replication from a master die. It should be noted that fabrication processes may produce an occasional fillet 132' or flat 139' in the groove array. To avoid the effects of such nonconformities, beam rotator 130 is preferably positioned close enough to laser bar 110 so that each laser beam covers less than the entire width of a reflecting surface.

Rotation of Laser Beams by Optical Beam Rotator 130

Optical beam rotator 130 is configured and positioned to individually reflect each incident laser beam twice. Laterally-collimated laser beam 180a, for example, is incident upon first reflecting surface 133 of beam rotator 130 and reflects to form an inverted laser beam 180b. Inverted laser beam 180b is subsequently incident upon second reflecting surface 134 and reflects to form a rotated laser beam 180c. Because rotated laser beam 180c had been collimated in the u-w plane, u-component 184c remains essentially unchanged in length from u-component 184a. In comparison, beam growth continues in the v-w plane and v-component 182c is shown as having increased in length from v-component 182a. A similar process is followed by laterally-collimated laser beam 181a, which is incident upon third reflecting surface 137 and reflects to form an inverted laser beam 181b. Inverted laser beam 181b reflects from fourth reflecting surface 138 to form a rotated laser beam 181c.

As a consequence of the two successive reflections performed on the laser beams, both laser beams 180 and 181 have been rotated 90° about their respective directions of propagation. U-component 184c of rotated laser beam 180c is now collinear with u-component 185c of rotated laser beam 181c whereas u-component 184 of laser beam 180 had been parallel to u-component 185 of laser beam 181. Likewise, the v-components 182c and 183c, of rotated laser beams 180c and 181c respectively, are parallel to one another, in contrast to v-components 182 and 183, of laser beams 180 and 181 respectively, which had been collinear. This rotation process is performed on each laser beam emitted by laser bar 110 with the consequence that the u-components of the arrayed laser beams are made to be collinear.

A secondary effect of optical beam rotator 130 is that the direction of propagation of the arrayed laser beams has also been changed by 90°. Initially, the w-axis, the direction of propagation for each laser beam, was antiparallel with the y-axis of laser-system xyz-coordinates 149. After reflection by beam rotator 130, the w-axis for rotated laser beams, shown by laser-beam uvw-coordinates 119c, is parallel to the z-axis of laser-system xyz-coordinates 149.

After the laser beam array has been reformatted by optical beam rotator 130, the beam array is subsequently converged into a more compact array configuration by means of the optical system comprising steering lens 140, collimating lens 150, and focusing lens 160 as shown in FIG. 6. Details of the operation of the optical system appear in related patent application Case No. 7918 assigned to the same assignee as the present application.

Description of Optical Fiber 170

FIG. 9 illustrates the cross-sectional structure and geometry of optical fiber 170 according to the present invention. The longitudinal dimension of optical fiber 170 extends generally along the z-axis of an xyz-coordinate system 179. Optical fiber 170 is comprised of a core 174 surrounded by an inner cladding 172. Core 174 comprises a suitable optical host, such as fused silica, which is doped in a well-known manner with a gain material. In the preferred embodiment, a silica doped with a rare earth element ion such as neodymium ($Nd^{3+}$) or yttrium, present in concentrations of up to 0.5 weight percent or lower, is used as the core dopant. Core 174 is generally circular in cross section, although other shapes, such as that of an ellipse, can be used as well.

Inner cladding 172 comprises material having an index of refraction, $n_2$, which is smaller than the index of refraction, $n_1$, of the core material. The cross-sectional shape of inner cladding 172 is that of a convex polygon. Optical fiber 170 also includes an outer cladding 176 comprising a material having an index of refraction, $n_3$, smaller than inner cladding index of refraction, $n_2$. Optical radiation is confined to inner cladding 172 by means of total internal reflection at the interface between it and cladding 176. Inner cladding 172 functions as a core with respect to outer cladding 176 to couple the radiation into core 174. Outer cladding 176 is preferably circular in cross section and is preferably made of a low-index fluorinated polymer.

Although the polygon is here depicted as a bilaterally symmetric quadrangle, it should not be construed that inner cladding 172 is limited to having this particular cross-sectional shape. In accordance with the present invention, several alternative cross-sectional shapes are disclosed below. An optical fiber waveguide having any of the disclosed cross-sectional shapes will induce incoming multimode optical radiation to form into an essentially uniform radiation field within the optical fiber. By a uniform radiation field is meant that the radiation field will have an essentially constant intensity throughout the cross-section of the optical fiber waveguide. Radiation propagating through optical fiber 170 forms into a uniform radiation field because of the geometric properties of the cross-sectional shape of inner cladding 172.

Because the radiation field produced is uniform, every optical ray propagating within optical fiber 170 will intersect core 174 at least once, but in practice many times, whether core 174 is placed anywhere within cladding 172, centered or eccentrically located within the fiber. Because every optical ray intersects core 174, all the power associated with the propagating optical radiation is available for absorption by core 174. In comparison, optimal coupling efficiency cannot be realized for a circular waveguide because not all propagating radiation intersects a core if a circular waveguide is used. Optimal coupling efficiency can be attained only if a uniform radiation field is present within the optical fiber waveguide.

A uniform radiation field is necessary if all the power in the propagating radiation is to be made available for absorption by the core dopant. The uniform field causes each radiation mode to periodically intersect the core and to transfer a portion of its power to the dopant. The total amount of power coupled into the core is related to the length of fiber used for the coupling process, and the concentration-length product which can be adjusted in a well-known manner so as to achieve substantially total absorption at a desired length.

Figure 10A:
Figure 10B:
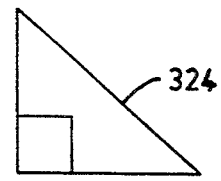
Figure 10C:
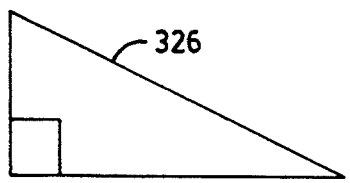
Figure 10D:
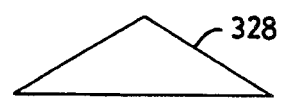

The preferred embodiments for an inner cladding in a double-clad fiber structure according to the present invention have cross sections in the shape of a polygon with three, four, or six sides. For example, the embodiments having cross sections in the shape of a three-sided polygon include an equilateral triangle 322, as shown in FIG. 10A, a right-isosceles triangle 324 as in FIG. 10B, a 30°-60°-90° triangle 326 as shown in FIG. 10C, and a 30°—30°-120° triangle 328 as shown in FIG. 10D.

Figure 11A:
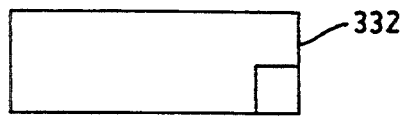
Figure 11B:
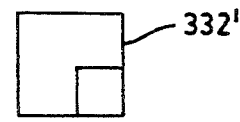
Figure 11C:
Figure 11D:
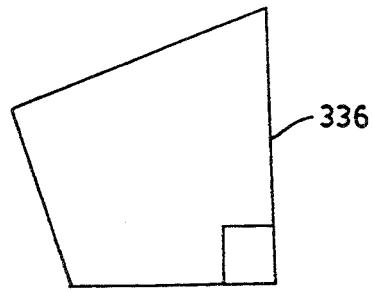

The embodiments having cross sections in the shape of a four-sided polygon include a rectangle 332 as shown in FIG. 11A, a square 332' as shown in FIG. 11B, a 60° rhombus 334 as shown in FIG. 11C, and a symmetrical quadrangle 336 having opposed vertex angles of 60° and 120 ° as shown in FIG. 11D. An embodiment having a cross section in the shape of a six-sided polygon is that of a regular hexagon 338 as shown in FIG. 12.

The particular cross section selected for a particular application will depend upon a number of considerations, including the physical attributes of the waveguide having the particular cross section selected and the nature of the radiation pattern from the pump source. A waveguide having the cross section of rectangle 332, for example, may be the most flexible in one direction. A waveguide having the cross section of square 332' may be easier to fabricate than a waveguide having the cross section of hexagon 338, but less material is removed from a round preform to form hexagon 338 than to form square 332'. For other applications in which a particular waveguide stacking arrangement is required, a waveguide having a triangular cross section may be optimal.

Alternative Embodiments

In an alternative embodiment, beam rotator 130 and collimating lens 120 are combined into a monolithic beam rotator 230 as shown in FIG. 11. Monolithic beam rotator 230 is formed from an optically-transparent material, such as glass or plastic and incorporates a cylindrical surface 222 which acts to collimate the laser beams 280 in a manner similar to lateral beam-collimating lens 120 in the embodiment described above. Preferably, the material selected is largely transparent to IR and near-IR wavelengths so as to avoid thermal effects in beam rotator 230.

An array of contiguous vee-shaped grooves, such as grooves 231 and 235, are formed in an oblique surface 226 which extends from a back side 224 to a front side 228 of monolithic beam rotator 230. Groove 231 is comprised of a first reflecting surface 233 and a second reflecting surface 234. Reflecting surfaces 233 and 234 are formed by planar boundaries between the optical-transparent material and an ambient medium. Reflection at these boundaries occurs because the optically-transparent material has an index of refraction $n_2$ larger than the index of refraction $n_1$ of air, which is the usual ambient medium.

Reflecting surfaces 233 and 234 are in opposed relationship to one another and meet at a common line of intersection, vertex edge 232. Adjacent to groove 231 is a groove 235 comprised of a third reflecting surface 237 and a fourth reflecting surface 238 which meet at a vertex edge 236. Preferably, all reflecting surfaces are of equal width. The grooves in the array are all similarly oriented so that alternating reflecting surfaces, such as first reflecting surface 233 and third reflecting surface 237, (or second reflecting surface 234 and fourth reflecting surface 238) are parallel to one another.

Reflecting surfaces 233 and 238 meet at a common line of intersection to form a concave reflecting pair 241 defining a dihedral angle $\Phi_2$ with an apex edge 239. A laser bar 210 emits laser beams 280 from an array of laser diodes 214. Each reflecting pair 241 in beam rotator 230 is configured and positioned to intercept and internally reflect one of the corresponding incident laser beams 280. Beam rotator 230 is oriented such that each apex edge 239 lies at a 45° angle in the x-y plane and also forms an angle of 135° in the y-z plane of the set of laser-system xyz-coordinates 249. This results in an aspect angle $\Psi_2$ of approximately 54.7° between the w-axis of propagation of laser beam 280 and apex edge 239 common to reflecting surfaces 238 and 233 reflecting laser beam 280. Upon passing integral beam rotator 230, laser beam 280 is rotated 90° to produce rotated laser beam 280c in a manner similar to the rotation of laser beam 180 described above.

Care is taken to avoid optical coupling between adjacent laser beams. To insure that there will be no such optical coupling, optical beam rotator 230 is positioned so that each laser beam is confined to a separate reflecting pair using the same analysis applied to preferred embodiment optical beam rotator 130 above.

The planar array of surface grooves can be readily formed by means of a cutting tool drawn from back side 224, across oblique surface 226, and terminating at front side 228 of integral beam rotator 230. Alternatively, the integral beam rotator can be molded from a plastic material.

In another alternative embodiment, an etched beam rotator 410, shown in FIG. 14, is fabricated from a strip cut from an etched wafer of a monocrystalline substance such as silicon or gallium arsenate. An array of grooves 411 is etched into the wafer before the strips are cut. By using an appropriate monocrystalline substance, the array of grooves can be formed by selective etching, as is well-known in the art. For silicon, the strips are cut so that the angle $\gamma$, formed by a groove vertex edge 412 and a long edge 417 of the etched beam rotator 410, is approximately 48.6°.

The groove angle of the etched grooves depends upon the crystal lattice properties of the substance being etched. For example, given a (100) oriented silicon wafer approximately 525 μm thick, grooves having a first reflecting facet 413 in the (111) plane and a second reflecting facet 414 in the (111) plane are formed. Facets 413 and 414 lie in opposed relationship to one another and meet at a common line of intersection, vertex edge 412, to form a dihedral angle $\Phi_3$ of approximately 70.5°. Additionally, the grooves are oriented parallel to a wafer reference flat lying in a (011) reference plane.

In yet another embodiment, a plurality of flat plates, tapered or wedged at one end, are stacked and cut to form grooved strips. One such wedged plate is provided for each reflecting surface. FIG. 15 shows a stacked beam rotator 430 comprising a series of wedged plates, such as first wedged plate 431 and second wedged plate 432. A reflecting facet 433 forms an angle $\alpha_1$ with plate 431, and a reflecting facet 434 forms an angle $\alpha_2$ with plate 432, such that the stacking of the plates results in a groove 435 forming a dihedral angle $\Phi_4$ of 60°.

While there have been described preferred embodiments of the present invention, it will be readily apparent to those skilled in the art that various changes and modifications may be made therein without departing from the invention, and it is intended in the wording of the appended claims to include such changes and modifications as would be encompassed by the true spirit and scope of the invention.

What is claimed is:

1. A high-power optical fiber device, comprising:

light source means for furnishing pump energy and having a plurality of aligned, light-emitting facets;

first means for collimating each light beam along a first azimuth, to decrease the growth of the light beam in said first azimuth as the beam passes through said first means for collimating and remains decreased in said first azimuth as the beam continues to propagate through said optical coupler;

an optical beam rotator for transforming the array of light beams, said beam rotator comprising:

a substrate having a grooved surface, said grooved surface comprising a plurality of adjacent grooves having a one-to-one correspondence with the light beams to be transformed, each said groove being formed of first and second reflecting surfaces which intersect along a common vertex edge and form a dihedral angle, $\Phi$, between them, the said vertex edge of each said groove being oriented at an aspect angle, $\Psi$, with respect to the initial direction of propagation of the corresponding light beam so that said first reflecting surface is positioned to intercept the incoming beam and to direct it to said second reflecting surface along a first path of travel, that is folded with respect to the incoming beam direction of propagation, while rotating one of its azimuths, while said second reflecting surface operates to intercept the beam reflected off said first surface and to direct it along a second path of travel, folded with respect to said first path of travel, while rotating the light beam's other azimuth, whereby the horizontal and vertical components of the initial orientation of the light beam are interchanged;

second means for collimating each light beam along a second azimuth, to decrease the growth of the light beam in said second azimuth as the beam passes through said second means for collimating and remains decreased in said second azimuth as the beam continues to propagate through said optical coupler, said second azimuth being orthonormal both to the direction of propagation of the light beam and to said first azimuth;

an optical fiber structure, said fiber structure comprising a core selectively doped with an active laser species and an inner cladding surrounding said core for purposes of receiving and transferring the pump energy to said core as the pump energy propagates along the length of said inner cladding, said inner cladding having a cross-sectional shape in the form of a convex polygon; and means for converging the array of light beams so that the array strikes said inner cladding.

2. A high-power optical fiber device as in claim 1 wherein said inner cladding has a cross-sectional shape in the form of a polygon with three sides.

3. A high-power optical fiber device as in claim 1 wherein said inner cladding has a cross-sectional shape in the form of a polygon with four sides.

4. A high-power optical fiber device as in claim 3 wherein said inner cladding has a cross-sectional shape in the form of a square.

5. A high-power optical fiber device as in claim 3 wherein said inner cladding has a cross-sectional shape in the form of a rectangle.

6. A high-power optical fiber device as in claim 1 wherein said inner cladding has a cross-sectional shape in the form of a regular hexagon.

7. A high-power optical fiber device, comprising:

light source means for furnishing pump energy and having a plurality of aligned, light-emitting facets;

a monolithic optical apparatus for transforming the array of light beams, said optical apparatus comprising an optically-transparent material having an index of refraction $n_2 > n_1$, where $n_1$ is the index of refraction of the ambient medium, said optical apparatus further having a cylindrical surface, for collimating each incoming light beam along a first azimuth, to decrease the growth of the light beam in said first azimuth as the beam passes through said cylindrical surface and remains decreased in said first azimuth as the beam emerges from said optical apparatus and continues to propagate through said optical coupler, said optical apparatus further having a grooved surface, said grooved surface comprising a plurality of adjacent grooves having a one-to-one correspondence with the light beams to be transformed, each said groove being formed of first and second reflecting surfaces which intersect along a common vertex edge and form a dihedral angle, $\Phi$, between them, the said vertex edge of each said groove being oriented at an aspect angle, $\Psi$, with respect to the initial direction of propagation of the corresponding light beam so that said first reflecting surface is positioned to intercept the incoming beam and to direct it to said second reflecting surface along a first path of travel, that is folded with respect to the incoming beam direction of propagation, while rotating one of its azimuths, while said second reflecting surface operates to intercept the beam reflected off said first surface and to direct it along a second path of travel, folded with respect to said first path of travel, while rotating the light beam's other azimuth, whereby the horizontal and vertical components of the initial orientation of the light beam are interchanged;

second means for collimating each light beam along a second azimuth, to decrease the growth of the light beam in said second azimuth as the beam passes through said second means for collimating and remains decreased in said second azimuth as the beam continues to propagate through said optical coupler, said second azimuth being orthonormal both to the direction of propagation of the light beam and to said first azimuth;

an optical fiber structure, said fiber structure comprising a core selectively doped with an active laser species and an inner cladding surrounding said core for purposes of receiving and transferring the pump energy to said core as the pump energy propagates along the length of said inner cladding, said inner cladding having a cross-sectional shape in the form of a convex polygon; and means for converging the array of light beams so that the array strikes said inner cladding.

8. A high-power optical fiber device as in claim 7 wherein said inner cladding has a cross-sectional shape in the form of a polygon with three sides.

9. A high-power optical fiber device as in claim 7 wherein said inner cladding has a cross-sectional shape in the form of a polygon with four sides.

10. A high-power optical fiber device as in claim 8 wherein said inner cladding has a cross-sectional shape in the form of a square.

11. A high-power optical fiber device as in claim 8 wherein said inner cladding has a cross-sectional shape in the form of a rectangle.

12. A high-power optical fiber device as in claim 7 wherein said inner cladding has a cross-sectional shape in the form of a regular hexagon.

* * * * *